United States Patent
Kawano et al.

(10) Patent No.: US 9,535,131 B2
(45) Date of Patent: Jan. 3, 2017

(54) METHOD FOR DETERMINING RESPONSE CHARACTERISTICS OF BATTERY

(71) Applicant: YOKOGAWA ELECTRIC CORPORATION, Musashino-shi, Tokyo (JP)

(72) Inventors: Makoto Kawano, Musashino (JP); Tomomi Akutsu, Musashino (JP); Nobuhiro Tomosada, Musashino (JP); Tetsuo Yano, Musashino (JP); Souichirou Torai, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/142,762

(22) Filed: Dec. 28, 2013

(65) Prior Publication Data
US 2014/0191764 A1  Jul. 10, 2014

(30) Foreign Application Priority Data
Jan. 10, 2013  (JP) .................... 2013-002789

(51) Int. Cl.
| | | |
|---|---|---|
| H02J 7/00 | (2006.01) | |
| G01N 27/416 | (2006.01) | |
| G01R 31/08 | (2006.01) | |
| H01M 2/00 | (2006.01) | |
| H01M 10/48 | (2006.01) | |
| G01R 31/36 | (2006.01) | |

(52) U.S. Cl.
CPC ....... *G01R 31/3662* (2013.01); *G01R 31/3627* (2013.01)

(58) Field of Classification Search
CPC .................................. G01R 31/3662

USPC ... 324/426, 430, 523, 527; 320/107; 429/61, 429/90–93
See application file for complete search history.

(56) References Cited

U.S. PATENT DOCUMENTS

| | | | | |
|---|---|---|---|---|
| 6,054,233 A | * | 4/2000 | Vourlis | H01M 2/34 429/162 |
| 7,336,081 B2 | * | 2/2008 | Kasamatsu et al. | 324/426 |
| 8,163,409 B2 | * | 4/2012 | Fujikawa et al. | 429/61 |
| 8,444,717 B2 | * | 5/2013 | Kasamatsu | H01M 6/50 29/623.1 |
| 8,471,566 B2 | * | 6/2013 | Nishino | H01M 2/34 324/426 |
| 2010/0028769 A1 | | 2/2010 | Enomoto et al. | |

FOREIGN PATENT DOCUMENTS

| | | |
|---|---|---|
| JP | 9-281201 A | 10/1997 |
| JP | 2001-185234 A | 7/2001 |
| JP | 2007-66590 A | 3/2007 |
| JP | 2008-27712 A | 2/2008 |
| JP | 201033922 A | 2/2010 |

OTHER PUBLICATIONS

K. Dokko, et. al., "Kinetic Characterization of Single Particles of LiCoO2 by AC Impedance and Potential Step Methods", Journal of the Electrochemical Society, 2001, 148(5), pp. A422-A426.

* cited by examiner

*Primary Examiner* — Richard V Muralidar
(74) *Attorney, Agent, or Firm* — Hauptman Ham, LLP

(57) ABSTRACT

A method for determining response characteristics of a battery includes: pressurizing the battery in a direction to reduce a distance between electrode surfaces of the battery; and applying a voltage or a current to the pressurized battery to determine response characteristics of the battery.

14 Claims, 4 Drawing Sheets

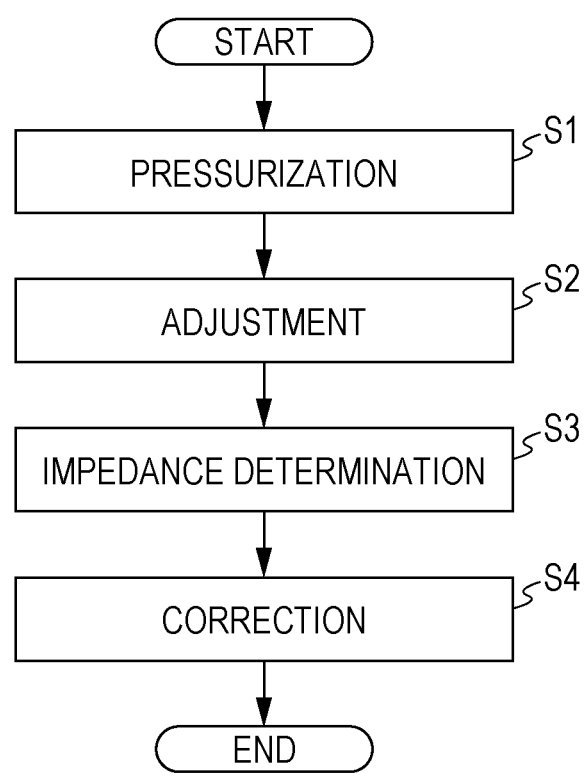

METHOD FOR DETERMINING RESPONSE CHARACTERISTICS OF BATTERY

CROSS-REFERENCE TO RELATED APPLICATION

This application is based on Japanese Patent Application No. 2013-002789 filed with the Japan Patent Office on Jan. 10, 2013, the entire content of which is hereby incorporated by reference.

BACKGROUND

1. Technical Field

The present disclosure relates to methods for determining response characteristics of a battery.

2. Related Art

One of methods for determining response characteristics of a battery is an impedance determination. In the impedance determination, an alternating voltage or an alternating current is applied to a battery to obtain current response or voltage response from the battery. Results of the impedance determination can be represented as, for example, a Nyquist plot.

Results of impedance determination vary depending on a history of battery state prior to starting of the impedance determination. Prior to the determination, for example, the voltage of a subject battery (hereinafter, referred to as a subject battery) is adjusted from initial voltage V0 to arbitrary set voltage Vs. The adjustment is made by charging or discharging the battery. The impedance determination is started, for example, immediately after completion of the voltage adjustment. Alternatively, the impedance determination may be started after a specific rest time since completion of the voltage adjustment. In the latter case, the rest time is not always fixed at a given period of time. An experimenter can arbitrarily determine the rest time. For example, "Kinetic Characterization of Single Particles of $LiCoO_2$ by AC Impedance and Potential Step Methods", K. Dokko et al., Journal of The Electrochemical Society, vol. 148, (5), A422-426 (2001) describes an example of setting a rest time prior to starting of impedance determination.

SUMMARY

The method for determining response characteristics of a battery includes pressurizing the battery in a direction to reduce a distance between electrode surfaces of the battery, and applying a voltage or a current to the pressurized battery to determine response characteristics of the battery.

BRIEF DESCRIPTION OF THE DRAWINGS

FIG. 2 is a flowchart of a procedure in the method for determining response characteristics;

FIG. 3A is a plan view of the battery and FIG. 3B is a front view thereof; FIG. 4A is a graph of the results of an impedance determination (Nyquist plot) performed by a conventional determination method without pressurization of a battery, and FIG. 4B is a graph of the results of an impedance determination (Nyquist plot) obtained at steps S1 to S4 illustrated in FIG. 2.

DESCRIPTION OF EMBODIMENTS

Figure 1:
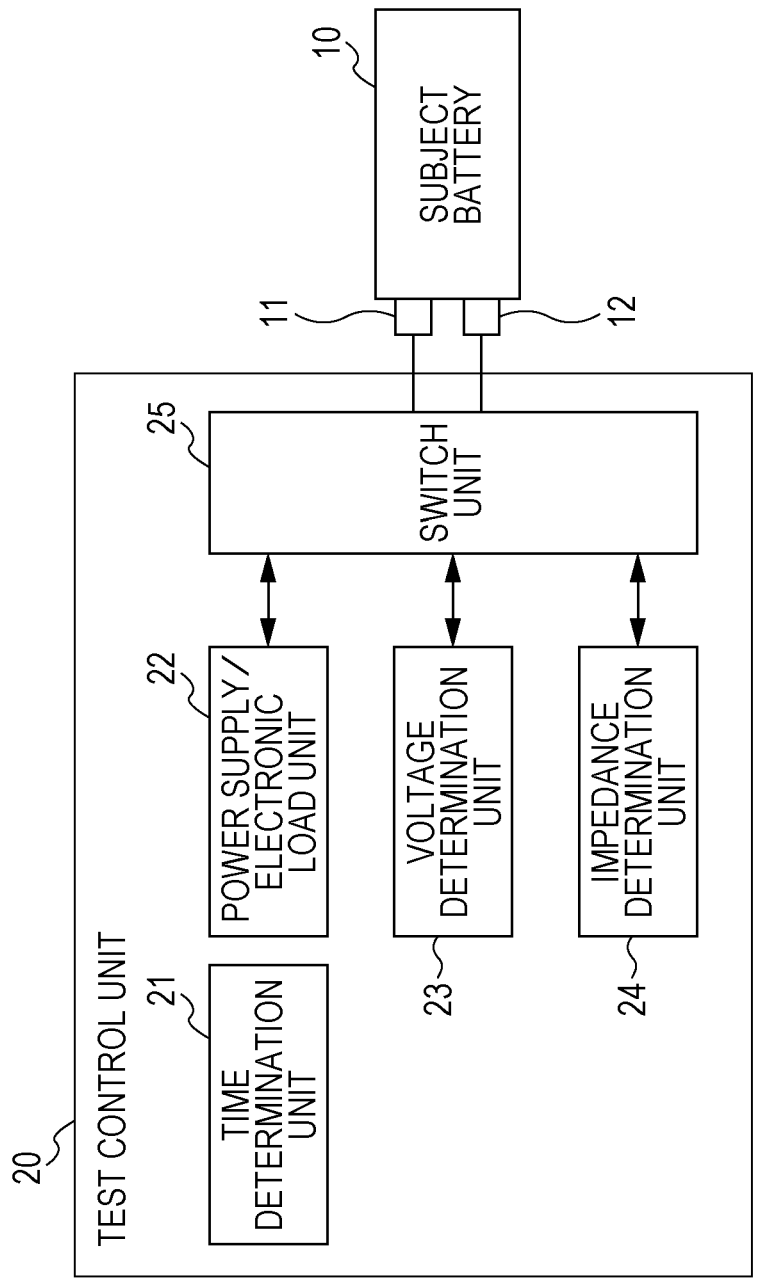
FIG. 1 is a block diagram illustrating a determination system for impedance determination used in a method for determining response characteristics according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Actual battery voltage and the like may be unstable even if the same value of set voltage Vs and the same procedure for adjustment to the set voltage Vs are used.

One of causes of such phenomenon is possibly expansion and contraction of electrodes due to charge and discharge of the battery. JP-A No. 2010-33922 discloses expansion and contraction of electrodes due to charge and discharge of the battery. That is, the distance between the electrodes may vary in each of charge and discharge cycles, resulting from expansion and contraction of the battery.

In addition, temperature and humidity conditions may not be consistent at each determination. Further, voltage scanning and time histories may not match those in a reference process. Such inconsistent temperature and humidity conditions or unmatched histories influence on response characteristics of the battery. In a situation where the conditions and histories are not managed, it is difficult to obtain stable determination results and reproducibility. In addition, determination results may be influenced by different degrees of factors other than battery characteristics at each determination. In this case, for example, evaluation of temporal change in the same battery or comparison of characteristics among a plurality of batteries may not be properly performed. Thus, a subject battery may be evaluated in an incorrect manner.

An object of the present disclosure is to provide a method for determining response characteristics of a battery by which it is possible to reduce influence of expansion or contraction of electrodes, obtain favorable reproducibility, and perform precise determination.

A method for determining response characteristics of a battery according to one embodiment of the present disclosure includes: pressurizing the battery in a direction to reduce a distance between electrode surfaces of the battery; and applying a voltage or a current to the pressurized battery to determine response characteristics of the battery.

According to the method for determining response characteristics, response characteristics of the battery are determined with application of a voltage or a current to the pressurized battery, and it is thus possible to determine response characteristics with favorable reproducibility.

During the determination of the response characteristics, the distance between the electrode surfaces may be kept constant by the pressurizing.

The pressurizing the battery includes sandwiching the battery between pressurizing members.

A method for determining response characteristics may further include correcting determined response characteristics of the battery according to determination conditions at the determination of the response characteristics.

The determination of the response characteristics may include determining impedances of the battery as response characteristics of the battery.

According to a method for determining response characteristics in the present disclosure, response characteristics of a battery are determined with application of a voltage or a current to the pressurized battery, and it is thus possible to determine response characteristics with favorable reproducibility.

A method for determining response characteristics according to one embodiment of the present disclosure (the determination method) will be described below.

FIG. 1 is a block diagram of a determination system for impedance determination that is used in the determination method.

The impedance determination is carried out using a test control unit 20.

As illustrated in FIG. 1, the test control unit 20 includes a time determination unit 21, a power supply/electronic load unit 22, a voltage determination unit 23, an impedance determination unit 24, and a switch unit 25. The time determination unit 21 determines and manages periods of time taken for respective steps of the impedance determination. The power supply/electronic load unit 22 charges and discharges a subject battery 10 and applies an alternating voltage or alternating current to the subject battery 10. The voltage determination unit 23 determines the direct voltage of the subject battery 10. The impedance determination unit 24 acquires response characteristics of the subject battery 10 and determines the impedance of the subject battery 10. The switch unit 25 controls connection relationships between the power supply/electronic load unit 22, the voltage determination unit 23 and the impedance determination unit 24, and the subject battery 10.

As illustrated in FIG. 1, a cathode terminal 11 and an anode terminal 12 of the subject battery 10 are connected to the test control unit 20 via the switch unit 25.

Next, the procedure for the determination method will be described.

FIG. 2 is a flowchart of the procedure for the determination method.

On determination, first, the subject battery 10 is pressurized (step S1). This keeps constant a distance between electrodes in the battery.

Figure 3A:
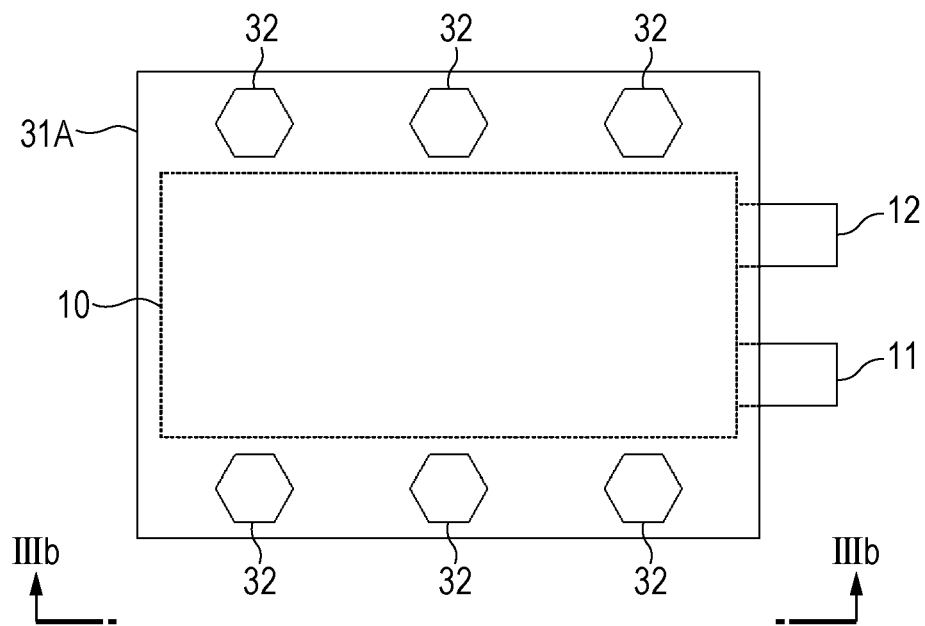
FIGS. 3A and 3B are diagrams illustrating a battery pressurized by pressurizing plates, where
Figure 3B:
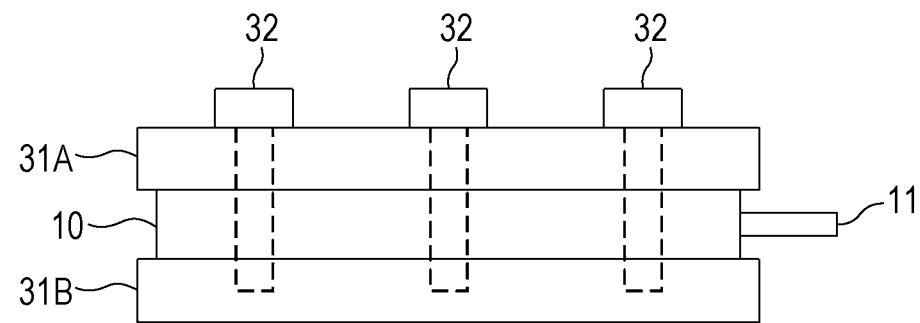

FIG. 3A is a plane view of the battery pressurized by pressurizing plates. FIG. 3B is a front view of the battery pressurized by the pressurizing plates.

As illustrated in FIGS. 3A and 3B, at step S1, the subject battery 10 is sandwiched between pressurizing plates 31A and 31B. The pressurizing plates 31A and 31B are tightened by a plurality of fixing tools 32 such as bolts. Thus, a force is applied to the subject battery 10 in a direction orthogonal to electrode surfaces of the subject battery 10 such that the subject battery 10 is held in the pressurized state. That is, the subject battery 10 is pressurized in a direction to reduce a distance between the electrodes. In this case, a uniform pressure is desirably applied to the entire electrode surfaces of the subject battery 10. For example, all the fixing tools 32 may be unified in tightening torque by torque management.

The configuration of a subject battery (such as the exterior package and electrode shape thereof) is various. Thus, an appropriate pressurization method may be adopted depending on the subject battery. For example, the exterior of the subject battery may be a can type and a laminate type. In a can-type exterior, the electrodes are stored in a can. In a laminate-type exterior, the electrodes are stored in a flat plastic package or the like. The shape of the electrodes may be cylindrical, square, sheet, and the like. The cylindrical electrodes are wound in a cylindrical form. The square electrodes are wound such that their cross sections are square or rectangular. The sheet electrodes are laminated. The subject battery 10 according to the embodiment is a sheet-shaped battery in which electrodes are laminated.

Then, at step S2 illustrated in FIG. 2, the internal state of the subject battery 10 is adjusted. The adjustment is made by using the power supply/electronic load unit 22 and the voltage determination unit 23 to give the subject battery 10 a specific experience (for example, an experience of charge and discharge). In a region with voltage sensitivity with respect to changes in SOC (state of charge), the subject battery 10 may be charged or discharged by control of a voltage (between the cathode terminal 11 and the anode terminal 12). Meanwhile, in a region with no voltage sensitivity (without change in voltage), the subject battery 10 may be charged or discharged by control of a current value.

Even if the subject battery 10 is finally adjusted to move to the state with the same voltage and the same SOC, the internal state of the battery varies depending on whether the subject battery 10 has reached the state by charge or discharge. Thus, the direction of the state change after completion of the adjustment may be changed. Further, it is difficult to completely eliminate the state change after completion of the adjustment. The subject battery 10 therefore may be charged or discharged using a predetermined current value at the adjustment of step S2. Thus, the internal state of the subject battery 10 can be kept constant after the adjustment.

In addition, the current value for charge or discharge (current value per electrode area) may be set to a small value (low rate). This makes it possible to reduce influence of a voltage drop in the subject battery 10. For example, when making the adjustment by control of a voltage, the subject battery 10 is charged or discharged in a constant current mode until the set voltage is reached. After that, the constant current mode is switched to a constant voltage mode in which the current value is controlled to maintain the set voltage. When the current value becomes equal to or less than a set value, it can be regarded that the adjustment is completed.

Then, at step S3 illustrated in FIG. 2, the subject battery 10 is determined in impedance. The impedance determination is performed using the power supply/electronic load unit 22 and the impedance determination unit 24. For example, an alternating voltage or alternating current is applied from the power supply/electronic load unit 22 to the subject battery 10 while a determination frequency is sequentially switched from higher to lower levels. Based on alternating current/voltage components at that time, the impedance determination unit 24 determines impedances at the frequencies. There is no particular limitation on the method for impedance determination at step S3 but any of a wide variety of conventional methods can be used.

During the impedance determination at step S3, the direct voltage of the subject battery 10 (voltage between the cathode terminal 11 and the anode terminal 12) is kept at a predetermined set voltage value by the power supply/electronic load unit 22. At the same time, the SOC of the subject battery 10 is controlled in a predetermined state. As in the foregoing, the adjustment procedure at step S2 is made uniform, and the internal state of the subject battery 10 is kept constant during the impedance determination. This makes it possible to secure reproducibility of the impedance determination.

Next, at step S4, the impedances determined at step S3 are corrected. As described above, during the impedance determination at step S3, the direct voltage and SOC of the subject battery 10 is controlled at the predetermined voltage value and kept in the predetermined state. Determination conditions may vary among impedance determinations. For example, during the impedance determination, the direct voltage and SOC of the subject battery 10 may shift from the predetermined voltage value and the predetermined SOC preset as target control values. In addition, the temperature and humidity in the environments of the impedance determination may vary among determinations. Accordingly, at step S4, the impedances determined at step S3 are corrected based on the direct voltage and SOC of the subject battery 10 during the impedance determination at step S3, and the temperature and humidity in the determination environments. By correcting at step S4 determination results obtained at step S3, it is possible to suppress influence of variations in determination conditions.

The amount of correction of impedances can be decided based on data acquired in advance. For example, the impedances may be determined on batteries of the same structure with changes in direct voltage, SOC, temperature, or humidity. Accordingly, it is possible to assess in advance the magnitude of influence of the direct voltage, SOC, temperature, or humidity on the impedances.

The correction of impedances may be made for one of elements including direct voltage, SOC, temperature, and humidity, or for two or more of the same.

Figure 4A:
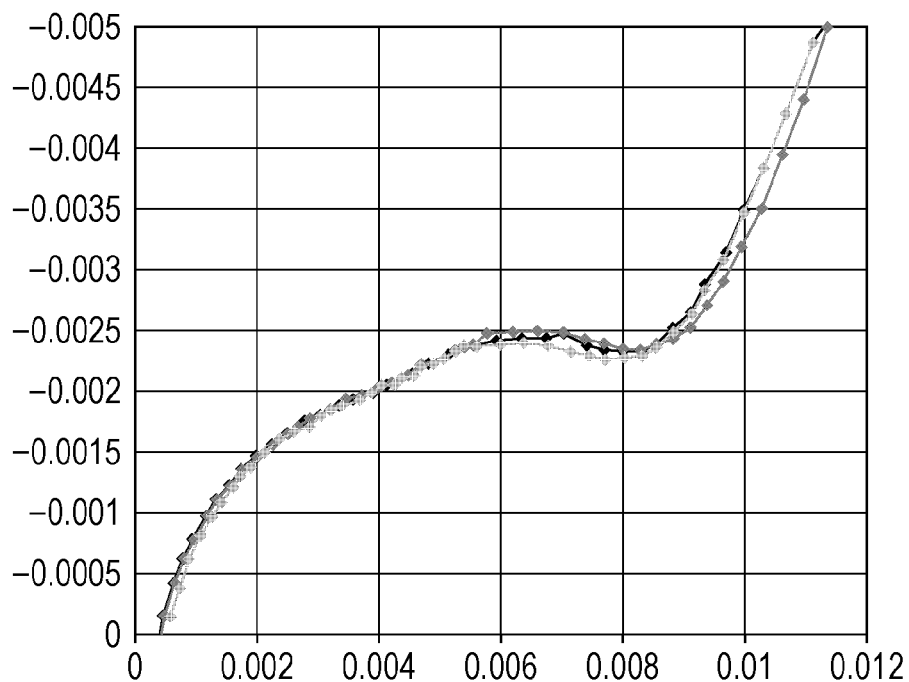
FIGS. 4A and 4B are graphs of the results of impedance determinations, where
Figure 4B:
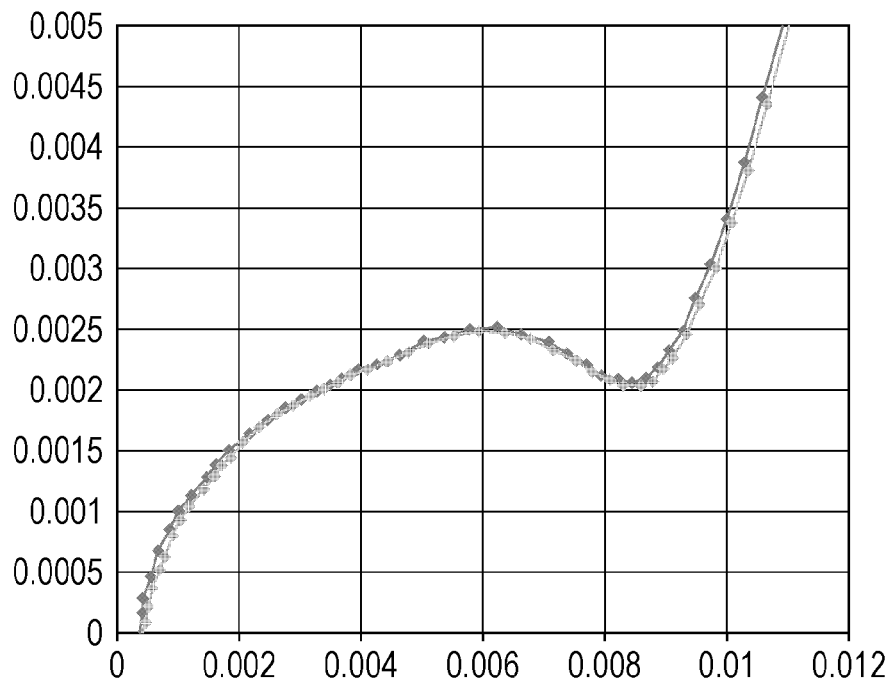

FIGS. 4A and 4B are diagrams representing advantages of the determination method. FIG. 4A is a diagram illustrating results of impedance determination by a conventional determination method (Nyquist plot) without application of a voltage. FIG. 4B is a diagram illustrating results of impedance determination (Nyquist plot) obtained at steps S1 to S4. As apparent by comparing the determination results in FIGS. 4A and 4B, according to the determination method, variations in determination results (Nyquist plot) resulting from a plurality of impedance determinations on one and the same battery are suppressed. Accordingly, it is understood that reproducibility of determination is improved.

As in the foregoing, in the determination method, there are set conditions on which the internal state of the battery can be regarded as constant without influence of variations among batteries in voltage, distance between electrodes, temperature, humidity, voltage scanning history, time elapsed from a reference procedure, and the like. Accordingly, the determination method makes it possible to determine response characteristics of a battery with favorable reproducibility and high precision. Thus, the determination results can be effectively used at shipping inspections, deterioration inspections, and the like. At the same time, different batteries can be precisely compared in battery characteristics.

In addition, the above step S4 corrects the results of impedance to effectively suppress influence of variations in conditions of the determination. Thus, the reproducibility of determination results can be further improved.

In the foregoing embodiment, the impedances of a battery are determined as a parameter indicative of response characteristics of the battery. However, the present disclosure is not limited to this but may be configured to measure direct resistance value, pulse response, step response, transient response, or the like. The determination method may be applied to various determination methods for determining response characteristics of a battery with application of a voltage or a current to the battery.

The applicable scope of the present disclosure is not limited to the foregoing embodiment. The present disclosure can be widely applied to response characteristics determining methods for determining response characteristics of a battery.

The method for determining response characteristics of a battery in the present disclosure may be one of first to fifth response characteristics determining methods as follows:

The first response determining method is a response characteristics determining method for determining response characteristics of a battery, including the steps of: pressurizing the battery in a direction to reduce a distance between electrode surfaces of the battery; and determining response characteristics of the battery pressurized at the pressurizing step with application of a voltage or a current to the battery.

According to the response characteristics determining method, response characteristics of the battery are determined with application of a voltage or a current to the pressurized battery, and it is thus possible to determine response characteristics with favorable reproducibility.

The second response characteristics determining method is configured such that, in the first response characteristics determining method, the distance between the electrode surfaces may be kept constant at the pressurizing step, during the determination at the determining step.

The third response characteristics determining method is configured such that, in the first or second response characteristics determining method, the battery may be pressurized by sandwiching between members at the pressurizing step.

The fourth response characteristics determining method is configured such that the first to third response characteristics determining methods include the step of correcting response characteristics of the battery determined at the determining step, according to determination conditions used at the determining step.

The fifth response characteristics determining method is configured such that, in the first to fourth response characteristics determining methods, impedances of the battery may be determined as response characteristics of the battery at the determining step.

According to the first to fifth response characteristics determining methods, response characteristics of a battery are determined with application of a voltage or a current to the pressurized battery, and it is thus possible to determine the response characteristics with favorable reproducibility.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:
1. A method for determining response characteristics of a battery, comprising:
   pressurizing the battery in a direction to reduce a distance between electrode surfaces of the battery; and
   applying a voltage or a current to the pressurized battery to determine response characteristics of the battery,
   wherein:
   the action of pressurizing the battery includes sandwiching the battery between pressurizing members so that a uniform pressure is applied to the entirety of the electrode surfaces of the battery, and during the determination of the response characteristics, the distance between the electrode surfaces is kept constant by the pressurizing.

2. The method for determining response characteristics of a battery according to claim 1, wherein the determination of the response characteristics includes determining impedances of the battery as response characteristics of the battery.

3. The method for determining response characteristics of a battery according to claim 1, wherein an internal state of the battery is adjusted by giving the pressurized battery a specific experience of charge and discharge prior to the determination of the response characteristics.

4. The device for determining response characteristics of a battery according to claim 1, further comprising:
determining the response characteristics of the battery while executing the action of pressurizing the battery.

5. The device for determining response characteristics of a battery according to claim 1, further comprising:
determining the response characteristics of the battery while the battery is pressurized, the pressurized battery resulting from the action of pressurizing the battery.

6. A device for determining response characteristics of a battery using the method for determining response characteristics of a battery according to claim 1, the device comprising:
a pressurization unit that pressurizes the battery in a direction to reduce a distance between electrode surfaces of the battery; and
a response characteristic determination unit that applies a voltage or a current to the battery pressurized by the pressurization unit to determine response characteristics of the battery.

7. The device for determining response characteristics of a battery according to claim 6, wherein
the pressurization unit includes a pair of pressurizing plates sandwiching the battery therebetween, and includes a plurality of fixing tools tightening the pressurizing plates.

8. A method for determining response characteristics of a battery, comprising:
pressurizing the battery in a direction to reduce a distance between electrode surfaces of the battery;
applying a voltage or a current to the pressurized battery to determine response characteristics of the battery; and
correcting the determined response characteristics of the battery according to determination conditions at the determination of the response characteristics,
wherein,
the action of pressurizing the battery includes sandwiching the battery between pressurizing members so that a uniform pressure is applied to the entirety of the electrode surfaces of the battery.

9. The method for determining response characteristics of a battery according to claim 8, wherein the determination of the response characteristics includes determining impedances of the battery as response characteristics of the battery.

10. The method for determining response characteristics of a battery according to claim 8, wherein an internal state of the battery is adjusted by giving the pressurized battery a specific experience of charge and discharge prior to the determination of the response characteristics.

11. A device for determining response characteristics of a battery using the method for determining response characteristics of a battery according to claim 8, the device comprising:
a pressurization unit that pressurizes the battery in a direction to reduce a distance between electrode surfaces of the battery; and
a response characteristic determination unit that applies a voltage or a current to the battery pressurized by the pressurization unit to determine response characteristics of the battery.

12. The device for determining response characteristics of a battery according to claim 11, wherein
the pressurization unit includes a pair of pressurizing plates sandwiching the battery therebetween, and includes a plurality of fixing tools tightening the pressurizing plates.

13. The device for determining response characteristics of a battery according to-claim 8, further comprising:
determining the response characteristics of the battery while executing the action of pressurizing the battery.

14. The device for determining response characteristics of a battery according to claim 8, further comprising:
determining the response characteristics of the battery while the battery is pressurized, the pressurized battery resulting from the action of pressurizing the battery.

* * * * *